United States Patent
Sawanoi et al.

(10) Patent No.: US 8,679,993 B2
(45) Date of Patent: Mar. 25, 2014

(54) GLASS COMPOSITION FOR GLASS FIBER, GLASS FIBER, AND GLASS FIBER SHEET

(75) Inventors: Kaori Sawanoi, Otsu (JP); Jiro Abe, Otsu (JP); Toshikatsu Tanaka, Otsu (JP)

(73) Assignee: Nippon Electric Glass Co., Ltd., Shiga (JP)

( * ) Notice: Subject to any disclaimer, the term of this patent is extended or adjusted under 35 U.S.C. 154(b) by 193 days.

(21) Appl. No.: 13/258,822

(22) PCT Filed: Nov. 16, 2009

(86) PCT No.: PCT/JP2009/069455
§ 371 (c)(1),
(2), (4) Date: Sep. 22, 2011

(87) PCT Pub. No.: WO2010/109721
PCT Pub. Date: Sep. 30, 2010

(65) Prior Publication Data
US 2012/0095149 A1 Apr. 19, 2012

(30) Foreign Application Priority Data

Mar. 25, 2009 (JP) .................................. 2009-073374

(51) Int. Cl.
*C03C 13/00* (2006.01)
*C03C 13/06* (2006.01)
*C03C 3/089* (2006.01)

(52) U.S. Cl.
USPC ..................... 501/35; 501/36; 501/66

(58) Field of Classification Search
USPC ................................. 501/35, 36, 66
See application file for complete search history.

(56) References Cited

U.S. PATENT DOCUMENTS

| | | | |
|---|---|---|---|
| 4,762,809 A | 8/1988 | Imai | |
| 4,824,806 A * | 4/1989 | Yokoi et al. | 501/35 |
| 5,958,808 A | 9/1999 | Mori et al. | |
| 7,786,035 B2 * | 8/2010 | Kishimoto et al. | 501/66 |
| 7,888,276 B2 * | 2/2011 | Takaya et al. | 501/67 |
| 7,960,301 B2 * | 6/2011 | Niida et al. | 501/56 |
| 2005/0209084 A1 * | 9/2005 | Takaya et al. | 501/11 |
| 2006/0160691 A1 * | 7/2006 | Kawaguchi et al. | 501/66 |
| 2007/0213194 A1 * | 9/2007 | Abensour et al. | 501/66 |
| 2008/0206494 A1 * | 8/2008 | Kurachi et al. | 428/1.62 |
| 2008/0269039 A1 * | 10/2008 | Joubaud et al. | 501/66 |

FOREIGN PATENT DOCUMENTS

| | | | |
|---|---|---|---|
| CN | 1955211 | | 5/2007 |
| JP | 0 250 259 | | 12/1987 |
| JP | 01051345 A | * | 2/1989 |
| JP | 6-219780 | | 8/1994 |
| JP | 7-10598 | | 1/1995 |
| JP | 8-333137 | | 12/1996 |
| JP | 63-2831 | | 1/1998 |
| JP | 10-167759 | | 6/1998 |
| JP | 2003-137590 | | 5/2003 |

OTHER PUBLICATIONS

International Search Report issued Jan. 12, 2010 in corresponding International Application No. PCT/JP2009/069455, of which the present application is the national stage.
International Preliminary Report on Patentability and Written Opinion issued Oct. 18, 2011 in corresponding International Application No. PCT/JP2009/069455, of which the present application is the national stage.
Chinese Office Action issued Apr. 22, 2013 in corresponding Chinese Patent Application No. 200980157573.2, with English translation.

* cited by examiner

*Primary Examiner* — Karl Group
*Assistant Examiner* — Elizabeth A Bolden
(74) *Attorney, Agent, or Firm* — Wenderoth, Lind & Ponack, L.L.P.

(57) ABSTRACT

A glass composition for a glass fiber includes, in terms of oxides by mass %, 45 to 65% of $SiO_2$, 10 to 20% of $Al_2O_3$, 13 to 25% of $B_2O_3$, 5.5 to 9% of MgO, 0 to 10% of CaO, 0 to 1% of $Li_2O+Na_2O+K_2O$, SrO, and BaO.

9 Claims, No Drawings

GLASS COMPOSITION FOR GLASS FIBER, GLASS FIBER, AND GLASS FIBER SHEET

TECHNICAL FIELD

The present invention relates to a glass composition for a glass fiber, which is excellent in meltability and spinnability and is used for, for example, a printed wiring board that is used for an electronic component or the like and requires high-density mounting, a glass fiber made of the glass composition, and a glass fiber sheet formed of the glass fiber.

BACKGROUND ART

With the development of various information instruments such as a mobile phone and a personal digital assistance (PDA), many kinds of electronic components such as a resistor, a condenser, and an integrated circuit have been, in a trend of utilizing a high-density mounting technology, mounted more frequently on a printed wiring board (which is also referred to as printed circuit board, rigid substrate, printed substrate, or printed wiring substrate) at a density higher than ever before. The printed wiring board is a sheet-shaped composite material formed by combining a resin, a glass fiber, a modifier, and the like at an appropriate ratio, and has a form in which a through-hole or the like for mounting various kinds of electronic components is provided. The printed wiring board is sometimes expressed by using an alias such as a module, a board, a unit, or a package depending on the functions and applications.

In the production of glass fiber that is used for the printed wiring board, there has been conventionally used a glass composition called E glass, which has an alkali-free glass composition. The E glass is a material that is excellent in electrical insulation, excellent in spinnability necessary for producing a glass fiber from glass in a melted state, and excellent in workability such as cutting workability, and hence the E glass is a glass material for a glass fiber which has been actually used frequently and is most well known. The E glass is a glass material which includes, in terms of oxides by mass %, for example, 52 to 56% of $SiO_2$, 12 to 16% of $Al_2O_2$, 5 to 10% of $B_2O_3$, 16 to 25% of CaO, 0 to 5% of MgO, 0 to 2% of an alkali metal oxide ($R_2O$), 0.05 to 0.4% of $Fe_2O_3$, and 0 to 1.0% of $F_2$.

On the other hand, for use in a printed wiring board, a high-frequency wave has been required to be applied in recent years in order to realize a high-speed electronic circuit. In this case, it is electrical characteristics of the printed wiring board that are emphasized as important. A transmission rate is in inverse proportion to the square root of a dielectric constant, and hence a low dielectric constant is necessary for improving the transmission rate. Further, a small dielectric loss is required, and a small dielectric dissipation factor is necessary for attaining that purpose. Note that the dielectric constant ($\in$) in the present invention accurately refers to a dimensionless number that means a specific dielectric constant, which is the ratio of the dielectric constant of a medium to the dielectric constant of a vacuum, but the dielectric constant ($\in$) is used in accordance with the conventional way. In general, when alternating current is applied to glass, the glass absorbs energy with respect to the alternating current by absorbing the energy as heat. Dielectric loss energy that is absorbed is in proportion to a dielectric constant and dielectric dissipation factor which are determined depending on the components and structure of glass, and is represented by $W=kfv^2 \times \in \tan \delta$. Here, W represents the dielectric loss energy, k represents a constant, f represents a frequency, $v^2$ represents a potential gradient, $\in$ represents the dielectric constant, and $\tan \delta$ represents the dielectric dissipation factor. From this equation, it is found that, as the dielectric constant and the dielectric dissipation factor are larger, or as the frequency is higher, the dielectric loss becomes larger. Thus, in order to make the dielectric loss smaller, the dielectric constant and the dielectric dissipation factor are required to be smaller.

Thus, a material for a glass fiber having a low dielectric constant and a low dielectric dissipation factor has been demanded in order to produce a glass fiber used for a printed wiring board. Patent Document 1 discloses a glass material called D glass, which has been developed to realize a dielectric constant and a dielectric dissipation factor lower than a dielectric constant of 6.7 and a dielectric dissipation factor of $12 \times 10^{-4}$ of the E glass at a frequency of 1 MHz at room temperature. The D glass is a glass material which includes, in terms of oxides by mass %, for example, 74.5% of $SiO_2$, 0.3% of $Al_2O_3$, 21.7% of $B_2O_3$, 0.5% of CaO, 0.5% of $Li_2O$, 1.0% of $Na_2O$, and 1.5% of $K_2O$. This glass has a dielectric constant of about 4.3 and a dielectric dissipation factor of about 10 to $20 \times 10^{-4}$ at 1 MHz.

However, it was pointed out that the D glass involved various problems in the production processes of a printed wiring board and a glass fiber and the like, though the D glass had excellent electrical performance. For example, the D glass is inferior to the E glass in meltability and frequently has problems such as broken yarns during spinning, and hence the production of a glass fiber is not easy. In addition, because the D glass has a fragile structure, the D glass is inferior in weaving performance in a weaving process that takes place to make a fabric form to be used for obtaining a printed wiring board, leading to reduction in the yield rate of products. Besides, a printed wiring board formed by using the D glass also involved a problem in that, in a drilling process for forming a via hole, which was a through-hole drilled for attaining interlayer conduction without inserting an electronic component lead, the wear of a drill became larger, and hence the accuracy of the position of the via hole lowered.

In order to solve such problems as described above, many inventions have hitherto been made. For example, Patent Document discloses a glass fiber having a low dielectric constant characterized by having, by mass %, a composition of glass of 50 to 60% of $SiO_2$, 10 to 18% of $Al_2O_3$, 18 to 25% of $B_2O_3$, 0 to 10% CaO, 1 to 10% of MgO, 0 to 1.0% of $Li_2O+Na_2O+K_2O$, and 0.1 to 1% of $Fe_2O_3$.

Patent Document 3 discloses a glass fiber having a low dielectric constant characterized by having, by mass %, a composition of 50 to 60% of $SiO_2$, 10 to 20% of $Al_2O_3$, 20 to 30% of $B_2O_3$, 0 to 5% of CaO, 0 to 4% of MgO, 0 to 0.5% of $Li_2O+Na_2O+K_2O$, and 0.5 to 5% of $TiO_2$.

In addition, Patent Document 4 discloses a glass having a low dielectric constant and a low dielectric dissipation factor characterized by having, by mass %, a composition of 48 to 80% of $SiO_2$, 0 to 18% of $Al_2O_3$, 11 to 35% of $B_2O_3$, 0 to 10% of MgO, 0 to 10% of CaO, 0 to 7% of $Li_2O+Na_2O+K_2O$, and less than 3% of $TiO_2$, having an $H_2O$ content of <800 ppm, and having a dielectric constant of 5.0 or less and a dielectric dissipation factor of $7 \times 10^{-4}$ or less at 1 MHz.

CITATION LIST

Patent Document

Patent Document 1: JP 63-2831 A
Patent Document 2: JP 10-167759 A
Patent Document 3: JP 08-333137 A
Patent Document 4: JP 2003-137590 A

SUMMARY OF INVENTION

Technical Problem

However, there are still problems to be solved in using the only inventions previously disclosed to develop a glass material which has satisfactory mechanical performance, is capable of easily suppressing the occurrence of glass defects such as devitrification, and is capable of realizing a low dielectric constant and a low dielectric dissipation factor, thereby providing a glass fiber having a low dielectric constant and a low dielectric dissipation factor.

For example, the glass composition described in Patent Document 2 was successful in decreasing the dielectric constant and dielectric dissipation factor of a glass fiber, but still involves a problem with its meltability at the early stage of forming molten glass, and bubbles are liable to remain in molten glass during melting the glass composition. Thus, it cannot be said that the glass composition is a composition sufficient for forming homogeneous molten glass.

Further, a printed wiring board is mounted on many kinds of electronic devices, and the surrounding environment of the electronic devices on each of which the printed wiring board is mounted is diversified. For example, an automobile today is mounted with many integrated circuits, and those electronic components are mounted with high density on a printed wiring board. However, components that are used in an automobile are required to provide reliability to driving on the road in an environment from an environment under the scorching sun in midsummer up to a very cold environment in the far north region. Further, in a passenger car in recent years, in order to secure sufficiently a space for passengers, an electronic circuit and the like have been installed more frequently in an environment which has a high environmental temperature and undergoes a more significant temperature change than ever before, such as an engine room and a site surrounding the engine room. Besides, there is a demand for a reduction in size of a substrate to be mounted.

Because of such various circumstance changes as described above, a printed wiring board for vehicle installation has been demanded to have higher heat resistance and higher through-hole reliability than ever before. This is because it is required to avoid completely the occurrence of significant damage such as the phenomenon that a difference in linear thermal expansion coefficient between a printed wiring board and amounted component results in thermal stress to cause solder cracks at a solder joint portion under a high-temperature environment, thereby leading to damaged electrical connection. That is, an electronic component used for vehicle installation is not allowed to undergo damage in its electronic circuit or the like caused by a significant temperature change, and the electronic component is required to provide long-term reliability. Thus, in order to satisfy such demand as described above, a printed wiring board that is used in an environment for vehicle installation is required to have a smaller linear thermal expansion coefficient to reduce a difference in linear thermal expansion coefficient from a mounted component. As a result, there has been demanded a glass fiber made of a glass material having a lower linear thermal expansion coefficient than E glass.

Further, with the progress in reduction in thickness of a printed substrate, which reflects a demand for the development of lighter, thinner, shorter, and smaller electronic devices, there is a tendency that a type of a glass fiber having a smaller diameter is demanded as a glass fiber used for a printed wiring board. However, when there is used the so-called "long" glass, such as D glass, which has a high spinning temperature and the viscosity of which does not change significantly depending on a change in temperature, it is difficult to produce a glass fiber having a small diameter and having a defect-free, stable grade under a limited production environment. Thus, it is required to use the so-called "short" glass, the viscosity of which changes sharply depending on a change in temperature. The glass composition in Patent Document 3 is "long" glass, which tends to have a high spinning temperature corresponding to $10^{3.0}$ dPa·s and is small in temperature dependence of a viscosity, and hence the glass composition is not suitable for producing a glass fiber having a small diameter. Further, when a glass composition has a high spinning temperature, large burden is applied to a production facility, and hence there also exists a problem in that the usable life of a production facility such as a bushing, which are used when fiber of glass is drawn out, is shortened. The glass composition in Patent Document 4 has a spinning temperature of as high as 1300° C. or more, and hence involves a problem in that the usable life of a spinning apparatus is shortened.

Further, when a glass fiber having a small diameter is produced, bubbles that may be contained as defects in molten glass are liable to cause the cutting of the glass fiber during the spinning of the glass fiber. Further, the bubbles are considered to be a problem because, when a glass fiber containing bubbles is included as a hollow fiber in a printed wiring board, through-hole plating may enter the hollow fiber to cause poor conduction, with the result that the reliability of the printed wiring board is lowered. When there is used glass having a temperature corresponding to $10^{2.0}$ dPa·s at a high level, the temperature being considered to be an indication of its melting temperature, such as D glass, a large amount of energy needs to be applied during melting the glass, and bubbles do not float up completely during the melting, resulting in the occurrence of many hollow fibers frequently. In order to reduce the number of bubbles in molten glass, it is effective to use a fining agent such as arsenic trioxide or antimony trioxide. However, these fining agents can be environmental load substances, and hence the phenomenon that these element components are included in members used for electronic devices is viewed as a problem.

Objects of the present invention are to provide a composition for a glass fiber which is capable of solving the various problems described above, easily provides homogeneous molten glass because of its low melting temperature, is excellent in spinnability of a glass fiber, has high chemical durability, realizes a low dielectric constant and a low dielectric dissipation factor that are demanded in a printed wiring board requiring high-density mounting, and has a lower linear thermal expansion coefficient, a glass fiber produced by spinning glass of the composition for a glass fiber, and a glass fiber sheet formed of the glass fiber.

Solution to Problem

The inventors of the present invention have made many studies on a glass fiber composition which is capable of certainly overcoming many difficult problems faced in applications of a printed wiring board that enable high-density mounting, and which is capable of stably producing a glass fiber having a small diameter. During the course of the studies, the inventors have paid particular attention to the roles of alkaline-earth metal elements in the glass composition. Then, the inventors have found that there can be provided, by adding a predetermined amount of each of these components, a glass fiber composition that is capable of solving the various problems described above and exerts unprecedented excellent performance and that the glass fiber composition can be formed into a glass fiber having a small diameter. Thus, the inventors now propose the finding as the present invention.

A glass composition for a glass fiber of the present invention includes, in terms of oxides by mass %, 45 to 65% of $SiO_2$, 10 to 20% of $Al_2O_3$, 13 to 25% of $B_2O_3$, 5.5 to 9% of MgO, 0 to 10% of CaO, 0 to 1% of $Li_2O+Na_2O+K_2O$, SrO, and BaO.

Here, a the phrase "includes, in terms of oxides by mass %, 45 to 65% of $SiO_2$, 10 to 20% of $Al_2O_3$, 13 to 25% of $B_2O_3$, 5.5 to 9% of MgO, 0 to 10% of CaO, 0 to 1% of $Li_2O+Na_2O+K_2O$, SrO, and BaO" has the following meaning.

That is, the phrase signifies that the composition of glass includes an $SiO_2$ component in the range of 45 mass % to 65 mass %, an $Al_2O_3$ component in the range of 10 mass % to 20 mass %, a $B_2O_3$ component in the range of 13 mass % to 25 mass %, an MgO component in the range of 5.5 mass % to 9 mass %, a CaO component at 10 mass % or less, and an $Li_2O$ component, an $Na_2O$ component, and a $K_2O$ component at a total content of 1 mass % or less, and additionally includes an SrO component and a BaO component, when element components forming the glass are expressed in terms of oxides by using any of various kinds of analysis means such as chemical analysis and instrumental analysis.

Further, if the glass composition for a glass fiber of the present invention includes 0.01 to 5.0% of $CeO_2$ in terms of oxides by mass %, in addition to the above-mentioned components, the number of bubbles in molten glass can be reduced. As a result, hollow fibers are inhibited from occurring, and a highly homogeneous glass fiber can be obtained.

Further, the glass composition for a glass fiber of the present invention preferably includes 0.1 to 10% of SrO and 0.1 to 10% of BaO, in terms of oxides by mass %, in addition to the above-mentioned components, because there is provided a glass composition in a state of being low in crystal precipitation property, that is, so-called devitrification property during melting the glass composition, and hence the glass composition can be easily melted into molten glass and can be formed into a glass fiber not having low water resistance and low acid resistance as glass.

That is, the phrase "includes 0.1 to 10% of SrO and 0.1 to 10% of BaO, in terms of oxides by mass %, in addition to the above-mentioned components" means including an SrO component at from 0.1 mass % to 10 mass % and a BaO component at from 0.1 mass % to 10 mass % in addition to the above-mentioned construction of the composition of glass, when element components forming glass are expressed in terms of oxides.

The reasons why the content of each of the components forming the glass composition for a glass fiber of the present invention is limited as describe above are described specifically in the following.

The $SiO_2$ component is a component that forms the framework of a network structure in the structure of glass and is a main component of the glass composition of the present invention. As the content of the $SiO_2$ component increases in the glass composition, the structural strength of glass tends to be higher. As the structural strength of glass becomes higher, the chemical durability improves accordingly and glass particularly having high performance in acid resistance is formed. In order to maintain the strength of glass structure in a satisfactory state, thereby forming glass having a stable grade, the content of the $SiO_2$ component needs to be controlled to at least 45 mass % or more and should be controlled to more preferably 48 mass % or more. On the other hand, as the content of the $SiO_2$ component in the glass composition increases, the viscosity value of molten glass becomes larger.

As a result, in order to produce the glass composition described above at high efficiency by a melting method so as for the glass composition to have a homogeneous quality, an expensive facility is required. Moreover, the forming temperature at which the glass composition is formed into a glass fiber becomes higher, and hence there sometimes occur limitations also with respect to facility control or the like during producing the glass fiber. Further, in order to provide easily homogeneous molten glass in which bubbles and the like produced in a vitrification reaction or the like do not remain when the glass composition melts, to prevent excessive heat energy from being used for melting glass, and to secure high spinnability during producing a glass fiber, the content of the $SiO_2$ component needs to be controlled to 65% or less.

The $Al_2O_3$ component is a component which is effective for realizing the chemical and mechanical stability of glass. When the $Al_2O_3$ component is contained in glass at a proper content, the $Al_2O_3$ component sometimes exhibits the effect of suppressing crystal precipitation and the generation of phase separation in molten glass. However, when the content of the $Al_2O_3$ component is large, the viscosity of molten glass increases. It is not preferred that the content of the $Al_2O_3$ component in the composition of glass be less than 10 mass %, because the phase separation property of molten glass deteriorates when glass melts. The deterioration of the phase separation property in molten glass is not preferred because the degradation of acid resistance of the resultant glass fiber is caused accordingly. Here, the phase separation means the phenomenon that molten glass is separated so as to have two or more glass phases. On the other hand, when the content of the $Al_2O_3$ component in the composition of glass is increased excessively, the content of other components, in particular, the $SiO_2$ component, becomes relatively smaller, thereby giving an adverse influence on the acid resistance. Thus, the content of the $Al_2O_3$ component needs to be controlled to 20 mass % or less, and should be controlled to more preferably 18 mass % or less, still more preferably 17 mass % or less, still more preferably 16 mass % or less, most preferably 15 mass % or less.

The $B_2O_3$ component is a component that forms the framework in the network structure of glass, as the $SiO_2$ component does. However, unlike the $SiO_2$ component, the $B_2O_3$ component does not increase the viscosity of molten glass, but rather functions to lower the viscosity. Thus, the $B_2O_3$ component has both roles to keep the dielectric constant of formed glass low and to suppress the increase of the viscosity of molten glass. If the content of the $B_2O_3$ component in the composition of glass is less than 13 mass %, it sometimes becomes difficult to control the temperature of molten glass corresponding to $10^{3.0}$ dPa·s, which is a spinning temperature, to less than 1,300° C. at which sufficient spinnability can be secured, while the dielectric constant of glass is being maintained at 6.0 or less. On the other hand, when the content of the $B_2O_3$ component in the composition of glass becomes excessively large, the vaporization amount of the $B_2O_3$ component increases while glass is being melted, sometimes resulting in difficulty in maintaining molten glass in a homogeneous state. Besides, when the content of the $B_2O_3$ component becomes excessively large, the acid resistance is liable to deteriorate, leading to the deterioration of the phase separation property in molten glass. From the viewpoints described above, it is not preferred that the content of the $B_2O_3$ component in the composition of glass be more than 25 mass %, because the acid resistance and phase separation property of glass deteriorate.

The MgO component is a component that functions as a melting accelerate component for facilitating melting of a glass raw material. In addition, the MgO component is very effective for lowering the viscosity which corresponds to the temperature corresponding to $10^{2.0}$ dPa·s, facilitates the bubble removal of glass during meting the glass, and contributes to producing homogeneous glass. Further, the MgO component has a function of converting glass to short glass by lowering the temperature corresponding to $10^{3.0}$ dPa·s, thereby improving the productivity significantly, and hence the MgO component contributes to efficiently producing a glass fiber having a small diameter. However, in order for the MgO component to function effectively in the glass composition to lower the viscosity at around $10^{3.0}$ dPa·s, which corresponds to the spinning temperature, the content of the MgO component needs to be controlled to 5.5 mass % or more. On the other hand, when the content of the MgO component in the composition of glass becomes excessively large, the phase separation property of molten glass becomes higher, the acid resistance deteriorates, and the dielectric constant increases. Thus, from the viewpoint of avoiding the phenomena, a glass composition containing the MgO component at more than 9 mass % is not preferred.

The CaO component is a component that functions to lower the viscosity of molten glass which corresponds to the temperature corresponding to $10^{2.0}$ dPa·s, as the MgO component is, and the CaO component shows the smallest increase rate of the dielectric constant among the components formed of alkaline-earth metal elements. However, when the CaO component is contained in the composition of glass at a large content, the phase separation property becomes higher and the acid resistance of glass lowers. Further, the dielectric constant of glass becomes larger as the CaO component increases. Thus, a glass composition containing the CaO component at more than 10 mass % is not preferred.

Alkali metal components in terms of oxides in the composition of glass, expressed as the $Li_2O$ component, the $Na_2O$ component, or the $K_2O$ component, each function as a so-called melting accelerate component, which facilitates the generation of a glass melt when a plurality of glass raw materials in a mixed state are heated to form the glass melt, and also function to lower the viscosity. However, as the content of the $Li_2O$ component, the $Na_2O$ component, or the $K_2O$ component in the composition of glass becomes larger, the value of the dielectric dissipation factor of glass increases, and hence the upper limit of the total content of those components is 1 mass %.

The SrO component is a component that functions to lower the viscosity of molten glass which corresponds to the temperature corresponding to $10^{2.0}$ dPa·s, and to lower the spinning temperature of molten glass corresponding to around $10^{3.0}$ dPa·s, but the extent of its function is not as large as the extents of the functions of the MgO component and the CaO component. However, the SrO component is a component that functions to suppress the deterioration of the phase separation property during melting glass caused by the increase of the MgO component and the CaO component and to suppress the lowering of the acid resistance of glass associated with the deterioration, and hence the SrO component is an essential component in the present invention. Such various functions exerted by containing the SrO component are performed more clearly when the SrO component is contained in the composition of glass at 0.1 mass % or more. On the other hand, when the SrO component is contained in a glass composition for a glass fiber, if its content is too large, long glass is formed, and hence it is difficult to produce a glass fiber having a small diameter. From the viewpoints described above, the upper limit of the content of the SrO component is preferably 10 mass %. If the phase separation property deteriorates, molten glass is separated so as to have a phase rich in acid resistance and a phase poor in acid resistance, when glass melts. In that case, the phase poor in acid resistance determines the acid resistance of a glass fiber, and the glass fiber has very poor acid resistance eventually. Thus, the deterioration of the phase separation property is not preferred.

The BaO component is, as the SrO component is, a component that functions to lower the viscosity of molten glass which corresponds to the temperature corresponding to $10^{2.0}$ dPa·s, and to lower the spinning temperature of molten glass corresponding to around $10^{3.0}$ dPa·s, but the extent of its function is not as large as the extents of the functions of the MgO component and the CaO component. However, the BaO component is a component that functions to suppress the deterioration of the phase separation property caused by the increase of the MgO component and the CaO component and to suppress the lowering of the acid resistance of glass associated with the deterioration, and the BaO component is an essential component for achieving the objects of the present invention as the SrO component is. The effects exerted by containing the BaO component are performed more clearly when the BaO component is contained in the composition of glass at 0.1 mass % or more, as in the case with the SrO component. On the other hand, when the BaO component is contained in a glass composition for a glass fiber, if its content is too large, the liquidus temperature deteriorates and long glass is formed, and hence it is difficult to produce a glass fiber having a small diameter. From the viewpoints described above, the content of the BaO component is preferably controlled to the range of up to 10 mass %. The long glass refers to glass whose viscosity has small dependence on the change of temperature, and the fiber of the long glass is difficult to be solidified by cooling.

Further, the SrO component and the BaO component easily form crystals with $SiO_2$. When the SrO component is contained in a composition of glass containing $SiO_2$, $SrO.SiO_2$ crystals easily precipitate, and when the BaO component is contained, $BaO.2SiO_2$ crystals easily precipitate. As a result, the liquidus temperature of glass tends to be higher. If the liquidus temperature is high, bushing nozzles clog due to precipitated crystals in the bushing nozzles during spinning of glass fiber. As a result, there occurs a problem in that some glass fibers are cut during the spinning. However, when the SrO component and the BaO component coexist in the composition of glass and the composition of glass includes an eutectic region of $SrO.SiO_2$ and $BaO.2SiO_2$, the liquidus temperature of glass lowers and hence crystals are unlikely to precipitate during the spinning. Thus, desired is a composition of glass in which both the SrO component and the BaO component are contained, that is, a composition of glass in which the SrO component and the BaO component coexist.

An $CeO_2$ component is a component that functions to cause bubbles existing as defects in molten glass to float up, thereby facilitating the fining of glass and that is added in a proper amount as a fining agent which is not an environmental load substance. The fining action of the $CeO_2$ component is exerted more clearly when the content of the $CeO_2$ component is controlled to 0.01% or more in terms of oxides by mass %, and more preferably when the content of the $CeO_2$ component is controlled to 0.02% or more. Note that, if the $CeO_2$ component is added too excessively, the devitrification property of molten glass is sometimes adversely affected. From the viewpoint described above, the content of the $CeO_2$ component should not exceed 5% in terms of oxides by mass %. The upper limit of the content of the $CeO_2$ component is preferably set to 4%, and should be more preferably set to 2%, in order to attain a more stable grade. When the $CeO_2$ component is added in an optimal amount, a non-hollow glass fiber can be provided.

To the glass composition for a glass fiber of the present invention, various other components can be added, if required, in addition to the above-mentioned components, as long as the addition of them does not significantly affect the performance of the glass composition for a glass fiber of the present invention. Specific examples of components that can be used in the components that form the glass composition for a glass fiber of the present invention includes $ZrO_2$, $P_2O_5$, $Fe_2O_3$, $SO_2$, $Cl_2$, $F_2$, $WO_3$, $Nb_2O_5$, rare-earth oxides such as $La_2O_3$ and $Y_2O_3$, or $MoO_3$. Any of those components can be contained if the content of each component is 3% or less in terms of mass %.

Further, in addition to the above-mentioned components, some trace components can be each contained at up to 0.1%, when the content of the components is expressed by mass %. Various trace components such as $Cr_2O_3$, $H_2O$, OH, $H_2$, $CO_2$, CO, He, Ne, Ar, and $N_2$ may be contained.

Further, the glass composition for a glass fiber of the present invention may include some rare metal elements in glass in trace amounts, as long as their inclusion does not significantly affect the performance of the glass composition for a glass fiber. For example, platinum group elements such as Pt, Rh, and Os may be each contained at up to 1000 ppm, that is, may be each contained at up to 0.1%, when the content of the platinum group elements is expressed by mass %.

Further, in the glass composition for a glass fiber of the present invention, in addition to the above-mentioned conditions, the total content of alkaline-earth metal oxides including MgO, CaO, SrO, and BaO is preferably 10 to 25% in terms of oxides by mass %, and a value obtained by dividing the total content of SrO and BaO by the total content of the alkaline-earth metal oxides is preferably in the range of 0.15 to 0.50, because the phase separation of glass is suppressed during melting the glass, the lowering of acid resistance caused by the phase separation is avoided, the spinning temperature is lowered, short glass is formed, and hence the productivity of non-hollow glass is enhanced. Further reasons for the above-mentioned preferred ranges are as described below. That is, there is a low risk that crystal precipitation and phase separation cause molten glass to be in a heterogeneous state when glass melts, there is formed glass whose viscosity at around the spinning temperature has large temperature dependence and is short, and a predetermined dielectric constant and a predetermined dielectric dissipation factor can be provided.

The phrase "the total content of alkaline-earth metal oxides including MgO, CaO, SrO, and BaO is 10 to 25% in terms of oxides by mass %, and a value obtained by dividing the total content of SrO and BaO by the total content of the alkaline-earth metal oxides is in the range of 0.15 to 0.50" means that a value obtained by dividing the total content value of Sr and Ba in terms of oxides by mass % by the total content value of Mg, Ca, Sr, and Ba, which are alkaline-earth metal elements, in terms of oxides by mass % is in the range of 0.15 to 0.50.

When the total content of alkaline-earth metal oxides including MgO, CaO, SrO, and BaO is less than 10% in terms of oxides by mass %, glass is difficult to have a sufficiently homogeneous state in the early stage of melting the glass, the viscosity of glass in a molten state becomes higher, and hence the forming temperature excessively rises, resulting in the reduction of the spinnability of a glass fiber. On the other hand, when the total content of alkaline-earth metal oxides including MgO, CaO, SrO, and BaO is more than 25% in terms of oxides by mass %, problems with the acid resistance and phase separation property occur.

Further, it is not preferred that the value obtained by dividing the total content of SrO and BaO by the total content of the alkaline-earth metal oxides be less than 0.15, because the total content of MgO and CaO relatively increases, with the result that the phase separation property of molten glass becomes more inclined to be higher, and the dielectric constant also becomes higher. On the other hand, when the value obtained by dividing the total content of SrO and BaO by the total content of the alkaline-earth metal oxides is more than 0.50, the dielectric constant may become too high. Further, in that case, the spinning temperature Ty becomes higher, glass tends to be longer, and hence the spinnability lowers and it becomes difficult to produce a glass fiber having a small diameter.

The glass composition for a glass fiber of the present invention preferably has a dielectric constant of 6.0 or less and a dielectric dissipation factor of $20 \times 10^{-4}$ or less at a frequency of 1 MHz in addition to the above-mentioned conditions because the dielectric loss of a printed wiring board becomes small.

The glass composition for a glass fiber of the present invention preferably has a dielectric constant of 6.0 or less and a dielectric dissipation factor of $100 \times 10^{-4}$ or less at a frequency of 10 GHz in addition to the above-mentioned conditions because the dielectric loss of a printed wiring board in which high frequency is used becomes additionally small.

When the glass composition for a glass fiber of the present invention has a volume electrical resistivity log ρ of 13 Ω·cm or more at 150° C. in addition to the above-mentioned conditions, the glass composition has sufficiently large electrical resistance, and hence, when the glass composition is used in a printed wiring board or the like, the glass composition can exert its stable performance.

Further, in the glass composition for a glass fiber of the present invention, it is suitable if the temperature Ty corresponding to $10^{3.0}$ dPa·s is less than 1300° C. and a value obtained by subtracting the temperature Tx corresponding to $10^{7.6}$ dPa·s from the Ty is in the range of 300 to 450° C., in addition to the above-mentioned conditions, because a glass fiber can be effectively produced without significantly changing a spinning apparatus or a spinning method of a glass fiber.

When the value obtained by subtracting the temperature Tx corresponding to $10^{7.6}$ dPa·s from the temperature Ty corresponding to $10^{3.0}$ dPa·s is equal to or more than 450° C., the viscosity of glass becomes long. Thus, when a glass fiber having a small diameter is spun, there occurs a problem in that a curved shape, that is, a meniscus which molten glass drawn from the tip of a nozzle provided at a bushing forms below the nozzle becomes unstable, and hence stable spinnability necessary for providing regular fiber diameters is not obtained. On the other hand, when the value obtained by subtracting the temperature Tx corresponding to $10^{7.6}$ dPa·s from the temperature Ty corresponding to $10^{3.0}$ dPa·s is equal to or less than 300° C., the viscosity of glass becomes too short. Thus, there occurs a problem in that, when other production conditions for obtaining a predetermined fiber diameter, such as a yarn-drawing speed and cooling conditions, are set, proper ranges of the conditions become narrower, and hence controlling a fiber diameter becomes difficult.

The glass fiber of the present invention is made of the glass composition for a glass fiber of the present invention. Because the average diameter of the glass fiber is 3 to 7.2 μm, particularly when the glass fiber is used for applications such as a printed wiring board which is required to have high density and reduced thickness, the performance of a composite material used for a printed wiring board, the composite material being formed by using such glass fiber having a small diameter, is significantly improved.

When the average diameter of the glass fiber is less than 3 µm, the fiber diameter is too small, and hence the production yield of a glass fiber becomes low in some cases. Further, when a glass fiber which deteriorated in quality time-dependently because of an environment in which the produced glass fiber was used is scattered in the air or the like, an environmental problem occurs, and it becomes necessary to construct an expensive treatment environment to prevent the deteriorated glass fiber from adversely affecting humans or the like in its recycle or the like. Thus, the glass fiber having an average diameter of less than 3 µm is not preferred because such various environmental problems are caused.

On the other hand, when the average diameter of the glass fiber is more than 7.2 µm, a glass fiber having less glass defects or the like and a stable grade can also be obtained by using a conventionally-used glass fiber made of a glass composition having a low dielectric constant even without using a glass fiber made of the glass composition of the present invention, and hence the glass fiber made of the glass composition of the present invention has a poor economical advantage.

From the viewpoints described above, the glass fiber of the present invention is preferably made of the glass composition for a glass fiber of the present invention, and the average diameter of the glass fiber is controlled to more preferably in the range of 3.1 to 6.5 µm, still more preferably in the range of 3.2 to 6.2 lam, still more preferably in the range of 3.3 to 5.5 µm, still more preferably in the range of 3.4 to 5.2 µm, most preferably in the range of 3.8 to 4.8 µm.

Further, if the glass fiber of the present invention includes two hollow fibers or less per 100,000 filaments in addition to the above-mentioned conditions, when the glass fiber is used for forming a printed wiring board, a highly reliable printed wiring board can be provided.

The phrase "two hollow fibers or less per 100,000 filaments" means that the number of hollow fibers is two or less in 100,000 filaments. The number of hollow fibers can be easily determined by immersing a glass cloth in an immersion liquid prepared so as to have the same refractive index as a glass fiber, observing the glass cloth under a transmitted light microscope (a magnification of 50), measuring the number of hollow fibers in the warp of the glass cloth, dividing the value obtained from the measurement by the number of filaments observed, and multiplying the value obtained from the division by 100,000.

Further, if the glass fiber of the present invention has a bubble-containing ratio of 0.01 piece or less per meter, in particular, 0.001 piece or less per meter in addition to the above-mentioned conditions, when the glass fiber is used for forming a printed wiring board, a composite material structure having reduced defects and a high degree of homogeneity can be provided, thereby enabling the printed wiring board to exert its performance in accordance its designing specifications.

The phrase "to have a bubble-containing ratio of 0.001 piece or less per meter" means that the number of bubbles in 1000 m of a glass filament is one or less, and the number of bubbles is counted with respect to all bubbles each having a length of 1 mm or more. The number of bubbles can be easily counted by immersing a glass fiber in an immersion liquid prepared so as to have the same refractive index as glass in a microscope.

Further, if the glass fiber of the present invention has a bubble-containing rate of 50 pieces or less per 100 g of glass in addition to the above-mentioned conditions, a higher grade can be realized, and the bubble-containing rate of the glass fiber should be controlled to more preferably 20 pieces or less per 100 g of glass, still more preferably 5 pieces or less per 100 g of glass. The bubble-containing rate refers to the number of bubbles in 100 g of glass mass.

The glass fiber may be coated with a coating agent for imparting desired physicochemical performance on its surface. Specifically, the glass fiber may be coated with a sizing agent, an antistatic agent, a surfactant, an antioxidant, a film-forming agent, a coupling agent, or a lubricant.

A silane coupling agent which can be used for surface treatment is exemplified by γ-aminopropyltriethoxysilane, N-phenyl-γ-aminopropyltrimethoxysilane, γ-glycidoxypropyltrimethoxysilane, γ-methacryloxypropyltrimethoxysilane, γ-(2-aminoethyl)aminopropyltrimethoxysilane, β-(3,4-epoxycyclohexyl)ethyltrimethoxysilane, N-β-(N-vinylbenzylaminoethyl)-γ-aminopropyltrimethoxysilane hydrochloride, γ-chloropropyltrimethoxysilane, γ-mercaptopropyltrimethoxysilane, vinyltriethoxysilane, or the like. The silane coupling agent may be appropriately selected depending on the kind of a resin to be combined with a glass fiber to be used.

If the glass fiber of the present invention is a product produced by forming a plurality of glass filaments which have the feature that the CV value of the diameter of a glass fiber obtained by dividing the standard deviation of the diameter by the average value of the diameter and multiplying the resultant value by 100 is 10% or less into chopped strands, a yarn, or a roving, in addition to the above-mentioned conditions, the glass fiber can be used in various cases in which a glass fiber having a small diameter is required, even if the various cases include applications other than application to a printed wiring board, in addition to the application to a printed wiring board. It is not preferred that the CV value of the glass fiber be more than 10%, because some troubles happen in the formability of the glass fiber or the like necessary for forming a precise shape.

The phrase "a product produced by forming a plurality of glass filaments which have the feature that the CV value of the diameter of a glass fiber is 10% or less into chopped strands, a yarn, or a roving" signifies a product which is produced by performing spinning by using a glass fiber producing apparatus in which various conditions are adjusted so that a value obtained by measuring the diameter of each filament in a glass strand produced by spinning the above-mentioned glass fiber of the present invention from molten glass, dividing the standard deviation of diameter by the average value of the diameter, and multiplying the resultant value by 100 is 10 or less, and cutting the resultant glass fibers into glass chopped strands, twisting the resultant glass fibers into a yarn, or aligning a plurality of glass filaments and winding them in a wound state to form a roving. Note that the standard deviation and average value of the fiber diameter are calculated based on the measurement values regarding 200 glass fibers.

In order to control the CV value of the diameter of the glass fiber to 10% or less, in the case of using, for example, a glass forming apparatus in which a bushing is provided with many heat resistant nozzles, it is recommended that the condition of each of a nozzle hole diameter, a nozzle length, a nozzle temperature, an ambient air temperature of a nozzle, a nozzle head pressure, a blowing speed, and a rate of drawing a glass filament be determined so as to be the optimum condition that is suitable for the composition for a glass fiber of the present invention.

The glass fiber of the present invention is preferably a product produced by forming a plurality of glass filaments which have the feature that the CV value of the diameter of a glass fiber is 10% or less into chopped strands, a yarn, or a roving, because the glass fiber having a uniform diameter can be formed into various shapes, and when the glass fiber is used for application to a printed wiring board, the glass fiber is formed into a glass cloth that has been subjected to spreading and widening treatment, thereby suppressing the variation of a hole position caused by the displacement of the tip of a drill during a drilling step of forming a through-hole and resulting in the enhancement of the accuracy of the hole position.

Further, the glass fiber of the present invention may be produced by using any production method as long as desired performance can be realized. Various kinds of production methods such as a direct forming method (DM method: direct melt method) and an indirect forming method (MM method: marble melt method) may be adopted depending on the applications and production amounts of the glass fiber. That is, it is recommended that the glass fiber of the present invention be a product produced by obtaining a glass fiber having a predetermined diameter by drawing a glass fiber from a bushing provided with a heat resistant nozzle, in addition to satisfying the above-mentioned conditions.

The glass fiber of the present invention is preferably a product that is used for an application to form an organic resin composite material by forming the glass fiber into a glass cloth or glass paper and then combining the resultant with an organic resin material, in addition to the above-mentioned conditions, because the glass fiber serves as the optimum glass fiber necessary for forming a high-density printed wiring board.

That is, the phrase "a product that is used for an application to form an organic resin composite material by forming a glass fiber into a glass cloth or glass paper and then combining the resultant with an organic resin material" refers to a product that is used for an application to form an organic resin composite material by weaving a glass fiber used as warp and weft into a fabric used as a glass cloth for a printed wiring board with any of various weaving methods or forming a chopped strand into glass paper by a wet method or a dry method, and then combining the resultant with an organic resin material.

A glass fiber forming the glass cloth produced by using the glass fiber of the present invention has, for example, 1 to 50 tex, preferably 1.5 to 23 tex, more preferably 1.5 to 15 tex. The cross-sectional shape or the like of each glass filament forming a bundled glass strand is not required to be particularly limited. The cross-sectional shape of each glass filament may be circular, elliptical, or oval. The number of twist of a glass fiber bundle is more preferably 2 or less per 25 mm.

Further, the glass cloth produced by using the glass fiber of the present invention is a glass cloth preferably having the construction that the number of filaments per 25 mm in warp and weft directions is 30 to 100 for each direction, and more preferably having the construction that 45 to 90 filaments are in the warp and 35 to 90 filaments are in the weft.

When a woven product produced by using the glass fiber of the present invention is used as a material for forming a printed wiring board, a process for producing the printed wiring board is specifically as the following. That is, a glass yarn or a twisted glass yarn unwound from a package of a glass yarn wound body or a twisted glass yarn wound body, which are formed of the composition for a glass fiber of the present invention, is subjected to warping by using a warper. The resultant is subjected to a second sizing with a sizing machine, followed by winding from a beam to a loom beam. The resultant is used for warp. A glass yarn or a g twisted glass yarn unwound from a package of a glass yarn wound body or a twisted glass yarn wound body is used for weft. Then, a glass cloth is woven by using an air-jet loom or the like. Organic components attaching to the woven glass cloth is removed by carrying out heating and burning (deoiling by heating), the resultant glass cloth is immersed in a treatment liquid containing a silane coupling agent, followed by drying (surface treatment). After that, a resin is impregnated in the dry glass cloth and the resultant glass cloths are laminated, followed by hardening of the resin, thereby yielding a laminated board for a printed wiring board.

Further, when the glass paper provided by using the glass fiber of the present invention is produced by using a chopped strand, the dimension in the longitudinal direction of the chopped strand is not limited. The dimension in the longitudinal direction of a fiber can be selected depending on its application. Further, any method of producing a chopped strand can be adopted. A strand spun after a melting step may be subjected to cutting processing immediately after the spinning, or it may be possible that a strand is first wound as a continuous fiber and then subjected to cutting processing with a cutting machine depending on its applications. In this case, any cutting method can be adopted. For example, an outer-diameter blade cutting machine, an inner-diameter blade cutting machine, a hammer mill, or the like can be used. Further, the aggregate form of a chopped strand is not particularly limited.

Further, in the glass cloth or the glass paper provided by using the glass fiber of the present invention, it may be possible to use together a fiber material excluding the glass fiber of the present invention, a solid additive, or a liquid additive depending on its applications. Further, as the fiber material excluding the glass fiber of the present invention, the fiber material being used together with the glass fiber material of the present invention in the case of forming the glass cloth or the glass paper, a D glass fiber, a glass fiber having a different composition, an organic fiber material, a ceramic fiber, a carbon fiber, or the like may be used. There is given a ceramics powder, an organic resin powder, a silicone powder, or the like as the solid additive. It may be possible to use at a suitable content, as the liquid additive, a polymerization accelerator, a polymerization inhibitor, an antioxidant, a decomposition reaction inhibitor, a diluent, an antistatic agent, a defloccu-lating agent, a modifier, a wetting agent, a drying agent, a mildew-proofing agent, a dispersant, a curing accelerator, a thickener, a reaction accelerator, or the like.

The glass fiber sheet of the present invention is preferably used for an application to form an organic resin composite material by combining the glass fiber of the present invention with an organic resin material.

Here, the phrase "used for an application to form an organic resin composite material by combining the glass fiber of the present invention with an organic resin material" means being used for an application to produce an organic resin composite material by forming a glass fiber containing, in terms of oxides by mass %, 45 to 65% of $SiO_2$, 10 to 20% of $Al_2O_3$, 13 to 25% of $B_2O_3$, 5.5 to 9% of MgO, 0 to 10% of CaO, 0 to 1% of $Li_2O+Na_2O+K_2O$, SrO, and BaO into a glass fiber sheet having a thickness of 1 mm or less, and impregnating an organic resin material having thermosetting property into the glass fiber sheet.

It is recommended to use, as the organic resin material having thermosetting property, a resin such as a phenol resin, an epoxy resin, a polyimide resin, or a bismaleimide resin.

Further, the glass fiber sheet of the present invention can be used for producing a printed wiring board that exerts various kinds of performance depending on its applications, if the glass fiber sheet is a glass cloth or glass paper in addition the above-mentioned conditions.

Woven fabrics having different textures can be adopted as the glass cloth. It is possible to use any woven fabric ranging from those having textures such as plain weaving and twill weaving to those having more complicated textures. Further, it is recommended to adopt, as the glass paper, a product produced by using a chopped strand, dispersing the chopped strand in white water as monofilaments, spreading the monofilaments thinly, and forming the spread monofilaments into a glass fiber sheet by using an organic binder. The following is an example of forming the glass fiber sheet in the case of using the chopped strand. Molten glass produced by melting the above-mentioned composition for a glass fiber of the present invention is continuously drawn out from a heat-resistant nozzle provided in a forming apparatus such as a bushing, and a sizing agent or the like is used to coat the surface of the resultant product, resulting in yielding a glass long fiber. Next, the resultant glass long fiber is wound around a paper pipe or the like, forming a cake (or also referred to as cheese). After that, necessary numbers of the glass long fibers are drawn together from cakes and cut with a glass fiber cutting machine so as for each resultant glass fiber to have a dimension of a predetermined length. After the resultant chopped strand is dispersed in white water, the resultant monofilaments are spread thinly on a mesh, and the spread monofilaments are laminated on a conveyer at random into a sheet-shape. The sheet-shape monofilaments are sprayed with a liquid binder from above and they go through the step of joining glass chopped strands to each other by curing the binder. As a result, provided is a glass fiber sheet formed of the glass chopped strands.

Effects of the Invention (1) The composition for a glass fiber of the present invention includes, in terms of oxides by mass %, 45 to 65% of $SiO_2$, 10 to 20% of $Al_2O_3$, 13 to 25% of $B_2O_3$, 5.5 to 9% of MgO, 0 to 10% of CaO, 0 to 1% of $Li_2O+Na_2O+K_2O$, SrO, and BaO, and hence the composition is excellent in spinnability during spinning a glass fiber, the composition can be easily formed into a glass fiber having a small diameter, and the resultant glass fiber is excellent in electrical performance such as a dielectric constant and a dielectric dissipation factor.

(2) The composition for a glass fiber of the present invention preferably includes, in terms of oxides by mass %, 0.01 to 5.0% of $CeO_2$, because molten glass in which the number of bubbles is suppressed can be formed into a highly homogeneous glass fiber, and hence the production efficiency of a glass fiber and the performance of the produced glass fiber are improved.

(3) If the composition for a glass fiber of the present invention includes, in terms of oxides by mass %, 0.1 to 10% of SrO and 0.1 to 10% of BaO, phase separation during meting glass and devitrification caused by crystal precipitation can be avoided.

(4) If the composition for a glass fiber of the present invention is a composition in which the total content of alkaline-earth metal oxides including MgO, CaO, SrO, and BaO is 10 to 25% in terms of oxides by mass %, and a value obtained by dividing the total content of SrO and BaO by the total content of the alkaline-earth metal oxides is in the range of 0.15 to 0.50, the viscosity of glass suitable for performing a spinning operation and the temperature dependence of the viscosity can be realized, and the composition is suitable for producing a high-grade glass fiber excellent in acid resistance and devitrification property.

(5) If the composition for a glass fiber of the present invention has a dielectric constant of 6.0 or less and a dielectric dissipation factor of $20 \times 10^{-4}$ or less at a frequency of 1 MHz, the composition can meet a demand for a high-speed electrical signal and can be used for producing a printed wiring board having a small dielectric loss, and hence the composition has performance suitable for being applied to a printed wiring board. Besides, if the composition has a dielectric constant of 6.0 or less and a dielectric dissipation factor of $100 \times 10^{-4}$ or less at a frequency of 10 GHz, the composition has properties more suitable for being applied to a printed wiring board using a high-frequency wave.

(6) The glass fiber of the present invention is made of the glass composition for a glass fiber of the present invention and has an average diameter of 3 to 7.2 µm, and hence the glass fiber is particularly suitable for a printed wiring board that realizes high-density mounting.

(7) If the glass fiber of the present invention is used for an application to form an organic resin composite material by forming the glass fiber into a glass cloth or glass paper and then combining it with an organic resin material, a glass fiber having high performance can be supplied in the optimum form depending on applications, and hence it becomes possible to improve the dielectric characteristic and heat resistance of a printed wiring board that is applied to various kinds of electronic circuits.

(8) If the glass fiber sheet of the present invention is used for an application to form an organic resin composite material by combining the glass fiber of the present invention with an organic resin material, the glass fiber sheet is suitable for producing a printed wiring board that exhibits a high grade and exerts stable performance, without changing conventional steps.

(9) Because the glass fiber sheet of the present invention is a glass cloth or glass paper, when a prepreg used in a process for producing a printed wiring board is produced, the prepreg can be produced without involving alterations in the conditions of its production. Thus, the glass fiber sheet does not hinder the process for producing a printed wiring board and is suitable for producing a printed wiring board that can be used even in an environment in which a significant change in temperature occurs.

DESCRIPTION OF EMBODIMENTS

Hereinafter, a composition for a glass fiber of the present invention, a glass fiber of the present invention, and methods of producing the glass fiber are specifically described based on examples.

Examples

Table 1 shows the composition of each composition for a glass fiber according to the examples of the present invention and evaluation results. The compositions of glass described in terms of oxides shown in Table 1 are all expressed by mass %.

TABLE 1

| Sample No. | Example | | | | | | | | | |
|---|---|---|---|---|---|---|---|---|---|---|
| | 1 | 2 | 3 | 4 | 5 | 6 | 7 | 8 | 9 | 10 |
| $SiO_2$ | 47.7 | 52.4 | 53.0 | 54.5 | 49.4 | 50.2 | 54.0 | 52.6 | 47.9 | 47.4 |
| $Al_2O_3$ | 13.7 | 11.7 | 13.7 | 13.7 | 13.7 | 13.7 | 13.7 | 13.7 | 15.7 | 18.7 |
| $B_2O_3$ | 20.0 | 17.0 | 16.0 | 14.0 | 19.0 | 17.0 | 14.0 | 18.0 | 14.0 | 15.0 |
| MgO | 6.8 | 7.3 | 6.8 | 7.1 | 7.3 | 7.3 | 8.7 | 5.5 | 6.0 | 6.0 |
| CaO | 5.3 | 4.8 | 3.8 | 3.8 | 4.1 | 4.8 | 3.5 | 4.8 | 5.8 | 8.8 |
| SrO | 2.0 | 1.3 | 1.3 | 1.3 | 1.3 | 1.3 | 3.0 | 1.1 | 8.8 | 2.8 |
| BaO | 4.1 | 4.8 | 4.8 | 5.0 | 4.8 | 4.8 | 2.0 | 3.8 | 0.8 | 0.8 |
| MgO + CaO + SrO + BaO (=ΣRO) | 18.2 | 18.2 | 16.7 | 17.2 | 17.5 | 18.2 | 17.2 | 15.2 | 21.4 | 18.4 |
| BaO + SrO/ΣRO | 0.34 | 0.34 | 0.37 | 0.37 | 0.35 | 0.34 | 0.29 | 0.32 | 0.45 | 0.20 |
| $Li_2O$ | — | — | — | — | — | — | — | — | — | — |
| $Na_2O$ | 0.2 | 0.25 | 0.15 | 0.2 | 0.2 | 0.25 | 0.25 | 0.2 | 0.05 | 0.05 |
| $K_2O$ | 0.1 | 0.15 | 0.25 | 0.1 | 0.1 | 0.15 | 0.15 | 0.1 | 0.05 | 0.05 |
| $Li_2O + Na_2O + K_2O$ | 0.3 | 0.4 | 0.4 | 0.3 | 0.3 | 0.4 | 0.4 | 0.3 | 0.1 | 0.1 |
| $CeO_2$ | 0.1 | 0.3 | 0.2 | 0.3 | 0.1 | 0.5 | 0.7 | 0.2 | 0.9 | 0.4 |
| Linear thermal expansion coefficient ($\times 10^{-7}/°C.$) [30-380° C.] | 44.7 | 44.4 | 40.9 | 40.4 | 43.7 | 44.2 | 42.6 | 39.2 | 49.0 | 43.9 |
| Temperature corresponding to $10^{7.6}$ dPa·s (=$T_x$) | 830 | 843 | 877 | 875 | 828 | 845 | 879 | 875 | 880 | 869 |
| Temperature corresponding to $10^{3.0}$ dPa·s (=$T_y$) | 1194 | 1234 | 1273 | 1284 | 1211 | 1224 | 1298 | 1275 | 1174 | 1295 |
| Temperature corresponding to $10^{2.0}$ dPa·s (=$T_w$) | 1384 | 1436 | 1479 | 1491 | 1404 | 1420 | 1502 | 1475 | | |
| Liquidus temperature (° C.) (=$T_L$) | 1020° C. or less | 1054 | 1022 | 1095 | 1000° C. or less | 1062 | | | | |
| Temperature dependence of viscosity: $T_Y - T_x$ (° C.) | 364 | 391 | 396 | 409 | 383 | 379 | 419 | 400 | 294 | 426 |
| $T_Y - T_L$ (° C.) | 190° C. or more | 180 | 251 | 189 | 211° C. or more | 162 | | | | |
| Volume electrical resistivity log ρ (Ω·cm) [150° C.] | 17.5 | 17.0 | 14.3 | 15.1 | 16.8 | 17.1 | 13.3 | 13.9 | 17.9 | 13.3 |
| Dielectric constant (∈) Frequency of 1 MHz | 5.50 | 5.49 | 5.39 | 5.46 | 5.47 | 5.48 | 5.45 | 5.36 | 5.82 | 5.59 |
| Frequency of 10 GHz | 5.6 | 5.6 | 5.5 | 5.6 | 5.6 | 5.6 | 5.6 | 5.4 | 5.9 | 5.7 |
| Dielectric dissipation factor (tan δ) Frequency of 1 MHz | 0.0010 | 0.0014 | 0.0012 | 0.0012 | 0.0010 | 0.0012 | 0.0014 | 0.0012 | 0.0009 | 0.0008 |
| Frequency of 10 GHz | 0.0042 | 0.0056 | 0.0048 | 0.0038 | 0.0041 | 0.0060 | 0.0063 | 0.0042 | 0.0094 | 0.0096 |
| Number of hollow fibers (pieces/100,000 filaments) | 0.0 | 0.6 | 1.2 | 1.5 | 0.6 | 0.7 | 1.5 | 1.3 | 0.7 | 1.5 |
| Acid resistance | ○ | ○ | ○ | ○ | ○ | ○ | ○ | ○ | ○ | ○ |

A glass sample of each of Sample No. 1 to Sample No. 10 corresponding to the examples was prepared in accordance with the procedures shown below.

First, each of a plurality of glass raw material seeds such as natural mineral glass raw materials and chemical glass raw materials was weighed to prepare a predetermined amount in gram unit of three decimal places so that each composition of glass in Table 1 was attained. Next, there was prepared a glass raw material-mixed batch in which a plurality of those raw materials were mixed so as to be in a homogeneous state, and the glass raw material-mixed batch was fed into a crucible made of platinum rhodium and having a volume of 500 cc. Next, the crucible made of platinum rhodium in which the raw material-mixed batch was placed was heated in an air atmosphere at 1550° C. for 5 hours in an indirectly heating electrical furnace, thereby causing the glass raw material-mixed batch to react chemically under the high temperature and resulting in the formation of molten glass. In order for the molten glass to have a homogeneous state, a heat resistant stirring bar was used to stir the molten glass in the middle of the melting by heating.

The molten glass having the homogeneous state was fed into a predetermined refractory casting mold to perform casting so as to have a predetermined shape. The resultant product was subjected to annealing treatment in an annealing furnace until its temperature reached room temperature, thereby yielding a glass molded body to be used for testing or the like.

The thus obtained glass formed body was used to measure, in the following procedures, various physical properties and the like of each glass composition in the examples of the present invention. Table 1 shows the results of the measurements collectively.

A known linear thermal expansion measuring machine which is proofed by using SRM-731 and SRM-738 of NIST as known standard samples for the linear thermal expansion coefficient is used to measure the linear thermal expansion coefficient of each glass composition in the temperature range of 30° C. to 380° C., and an average linear thermal expansion coefficient is calculated. As the value of the linear thermal expansion coefficient is lower, expansion of a glass fiber becomes smaller even if temperature change is significant. As a result, when a printed wiring board in which the glass fiber is used is mounted on an electronic device, reliance on temperature variation is eventually enhanced.

In order to determine the temperature (Ty) corresponding to $10^{3.0}$ dPa·s indicating the viscosity of molten glass, each glass sample preliminarily pulverized into pieces having proper sizes is fed into a crucible made of alumina and is reheated to a molten state, and then, the viscosity of each glass sample is measured a plurality of times based on a platinum sphere pull up method, and each value is calculated by interpolation of a viscosity curve obtained on the basis of the measurement results. Further, the value of (Ty−Tx) in the table is calculated by subtracting the value of a softening point which is the temperature corresponding to $10^{7.6}$ dPa·s from the temperature value corresponding to $10^{3.0}$ dPa·s. Note that the softening point refers to a value obtained by measurement by a method in accordance with ASTM C338. As the value of (Ty−Tx) is smaller, the temperature dependence of the viscosity of glass is larger, which indicates that the glass is short. As glass is shorter, the state of the glass is likely to be changed from a molten state to a solidified state by cooling. Thus, in the case where, after spinning is carried out by ejecting the shorter glass in a molten state from a nozzle provided at a bushing, the resultant product is cooled even under the same cooling condition as other types of glass, the meniscus of the shorter glass is more stable, and hence the glass fiber of the shorter glass can be produced without being cut. As the temperature dependence of the viscosity of a glass fiber is longer, the meniscus becomes longer and more unstable, and hence ancillary facilities for producing a glass fiber must be reinforced such as reinforcing cooling conditions.

Further, the liquidus temperature $T_L$ of glass was determined as follows. Each glass molded body was cut into pieces having a predetermined shape and the pieces were subjected to grinding processing, yielding grains having a predetermined size. By removing finely-ground products, the size of the grains was adjusted so as to be in the range of 300 μm to 500 μm so that the surface area of the grains fell within a predetermined range. Then, while the adjusted state was being kept, the grains were filled in a container made of platinum so as to have a proper bulk density, and the container made of platinum was placed in an indirect-heating-type gradient heating furnace in which the highest temperature was set to 1250° C., followed by being left to stand, to thereby perform a heating operation for 16 hours in an air atmosphere. After that, the specimen was taken out together with the container made of platinum and cooled to room temperature. After that, the liquidus temperature $T_L$ was determined with a polarizing microscope. The value of (Ty−$T_L$) in the table is a value obtained by subtracting the value of the liquidus temperature $T_L$ from the temperature value corresponding to $10^{3.0}$ dPa·s . As the value of (Ty−$T_L$) is larger, crystals that hinder a spinning operation do not easily precipitate at around the spinning temperature and a stable spinning state can be ensured. In order to increase the value of (Ty−$T_L$), the temperature Ty which is the spinning temperature and corresponds to $10^{3.0}$ dPa·s is recommended to be increased. However, the increase leads to the occurrence of a problem in that energy required for melting glass becomes larger, resulting in the increase of production cost and a problem in that the usable life of ancillary facilities such as a bushing is shortened.

The volume electrical resistivity of glass at 150° C. is a value obtained by measurement at 150° C. based on ASTM C657-78. As the value of the volume electrical resistance is higher, even a printed wiring board on which high-density mounting is performed can exert stable electrical insulation performance.

In order to measure the dielectric constant ($\in$) and the dielectric dissipation factor (tan δ) of glass at a frequency of 1 MHz, there was used a sample obtained by polishing with 1,200 grit sand paper both surfaces of a glass sample strip having a thickness of 3 mm, the glass sample strip having been produced so as to have dimensions of 50 mm by 50 mm by 3 mm. The measurement was performed, in accordance with ASTM D150-87, under room temperature by using a 4192A impedance analyzer manufactured by Yokogawa-Hewlett-Packard Ltd. The measurement of the dielectric constant ($\in$) and the dielectric dissipation factor (tan δ) at a frequency of 10 GHz was performed under room temperature by using a cylindrical dielectric resonator method in accordance with JIS R1627: 1996 by using a network analyzer manufactured by Agilent Technologies Inc. As the dielectric constant and the dielectric dissipation factor have a smaller value, when a glass fiber is used for the purpose of forming a printed wiring board, the dielectric loss of the printed wiring board becomes smaller.

The acid resistance of glass was determined as follows. By removing finely-ground products from grains of each glass molded body, the size of the grains was adjusted so as to be in the range of 300 μm to 500 μm so that the surface area of the grains fell within a predetermined range. Then, while the adjusted state was being kept, grains equivalent to 1 cm³ were fed into an acid-resistant airtight container together with 50 cc of a 10 mass % hydrochloric acid aqueous solution. While the state was being kept, the grains were retained for 16 hours in a constant-temperature shaker whose temperature was set to 80° C., followed by filtration to remove liquid component. The resultant grains were dried in a 110° C. dryer and the constant mass value of glass was obtained. Then, the reduction rate of the mass value of glass after the acid treatment to the original mass value of glass was measured. A sample which was confirmed to have a resultant reduction rate measurement value of 30% or more and was confirmed to have formed a reaction product in the middle of a corrosion reaction on the surface of glass caused by hydrochloric acid in the acid resistance test was determined to have decreased acid resistance as glass, and the determination was represented by the symbol "×". Other samples were represented by the symbol "○". The reason why the above-mentioned sample was determined as "×" is that, when acid treatment is carried out in plating treatment or the like that is performed in a process for producing a printed wiring board using a glass fiber, a reaction product is formed by a corrosion reaction, thereby preventing homogeneous acid treatment from being applied and probably leading to reduction in yield rate.

The above-mentioned tests revealed the following. That is, the samples of Test No. 1 to Test No. 10 obtained in the examples of the present invention each include, as a composition of glass expressed in terms of oxides by mass %, $SiO_2$ in the range of 47.4% to 54.5%, $Al_2O_3$ in the range of 11.7% to 18.7%, $B_2O_3$ in the range of 14.0% to 20.0%, MgO in the range of 5.5 to 8.7%, CaO in the range of 3.5 to 8.8%, $Li_2O+Na_2O+K_2O$ in the range of 0.1 to 0.4%, SrO in the range of 1.1 to 8.8%, and BaO in the range of 0.8 to 5.0%, provided that the total content of alkaline-earth metal oxides including MgO, CaO, SrO, and BaO is in the range of 15.2 to 21.4%, and a value obtained by dividing the total content of SrO and BaO by the total content of the alkaline-earth metal oxides is in the range of 0.20 to 0.45, and each include $CeO_2$ in the range of 0.1 to 0.9%.

Further, as shown in Table 1, respectively, each of the examples of the present invention has an average linear expansion coefficient in the temperature range of 30° C. to 380° C. in the range of $39.2 \times 10^{-7}$ to $49.0 \times 10^{-7}$/° C., has a temperature which is the spinning temperature and corresponds to $10^{3.0}$ dPa·s in the range of 1194° C. to 1298° C., has a temperature Tx which corresponds to $10^{7.6}$ dPa·s in the range of 828° C. to 880° C., and has a value of (Ty−Tx) showing the temperature dependence of the viscosity in the range of 364° C. to 426° C. Further, each of the examples of the present invention has a liquidus temperature $T_L$ in the range of 1000° C. or less to 1095° C., and hence has a value of (Ty−$T_L$) in the range of 162° C. to 251° C. Further, each of the examples of the present invention has a temperature Tw which is an indication of the melting temperature and corresponds to $10^{2.0}$ dPa·s in the range of 1384° C. to 1502° C., which is lower than that of D glass. Further, as for electrical properties, each of the examples of the present invention has a volume electrical resistivity log ρ at 150° C. in the range of 13.3 Ω·cm to 17.9 Ω·cm, has a dielectric constant (∈) at a frequency of 1 MHz in the range of 5.36 to 5.82, which satisfy a dielectric constant of 6.0 or less, which is a requirement of the present invention, and has a dielectric dissipation factor (tan δ) at a frequency of 1 MHz in the range of 0.0008 to 0.0014, which also satisfy a dielectric dissipation factor of 20×$10^{-4}$ or less, which is a requirement of the present invention. Further, each of the examples of the present invention has a dielectric constant (∈) at a frequency of 10 GHz in the range of 5.4 to 5.9, which satisfy a dielectric constant of 6.0 or less, which is a requirement of the present invention, and has a dielectric dissipation factor (tan δ) at a frequency of 10 GHz in the range of 0.0038 to 0.0096, which also satisfy a dielectric dissipation factor of 100×$10^{-4}$ or less, which is a requirement of the present invention. Further, each of the examples of the present invention has a hollow fiber number of 1.5 pieces or less/100,000 filaments, which indicates an excellent grade. That is, Sample No. 1 to Sample No. 10, corresponding to the examples of the present invention, have suitable properties as the glass fiber composition of the present invention.

Particularly characteristic samples among the samples in the examples of the present invention are described below.

The glass composition corresponding to Sample No. 1 in the examples includes $SiO_2$ at 47.74%, which is the least content, but the content is compensated by including $B_2O_3$ at 20.0%, which is the largest content. Sample No. 1 has an expansion coefficient of 44.7×$10^{-7}$/° C., which is a sufficiently low value, and has a value of (Ty−Tx) of 364° C., which is an acceptable level, the value showing the temperature dependence of the viscosity. Further, Sample No. 1 has a Ty of 1194 ° C., the Ty corresponding to the spinning temperature, and has a temperature Tw of 1384° C., which is a sufficiently low value, the temperature Tw being an indication of the melting temperature and corresponding to $10^{2.0}$ dPa·s. Further, Sample No. 1 has a liquidus temperature $T_L$ of 1020° C. or less and has a value of (Ty−$T_L$) of 190° C. or more at least, and hence the value is sufficiently large. Further, Sample No. 1 has a volume electrical resistivity of 17.5 Ω~cm, which is a sufficiently large value, has a dielectric constant ∈ of 5.50 and a dielectric dissipation factor of 0.0010 at a frequency of 1 MHz, and has a dielectric constant ∈ of 5.6 and a dielectric dissipation factor of 0.0042 at a frequency of 10 GHz, and hence any of those values is satisfactorily small. Further, the acid resistance was determined as "○" because the reduction rate of mass was low and the formation of a reaction product was not found. Further, Sample No. 1 includes $CeO_2$, which indicates that consideration is taken so as to promote the fining of molten glass and to prevent hollow fibers from occurring. As described above, the glass composition corresponding to Sample No. 1 in the examples is suitable as the present invention. Then, the glass molded body was used to perform evaluations on how well the glass molded body was formed into a glass fiber. As a result, it was found that problems such as devitrification did not occur, bubbles did not remain in the glass fiber, and the measurement of the number of hollow fibers in the glass fiber showed that a homogeneous glass fiber satisfying 2 pieces or less/100,000 filaments was able to be spun.

The glass composition corresponding to Sample No. 2 in the examples is characterized by including $Al_2O_3$ at 11.7%, which is the least content, and includes $CeO_2$. Sample No. 2 is a typical sample of the present invention, has an expansion coefficient of 44.4×$10^{-7}$/° C., which is a satisfactorily low value, and moreover, has a value of (Ty−Tx) of 391° C., the value showing the temperature dependence of the viscosity, and hence Sample No. 2 has a sufficiently short viscosity. Sample No. 2 has a temperature of as low as 1436° C., the temperature being an indication of the melting temperature and corresponding to $10^{2.0}$ dPa·s, has a liquidus temperature $T_L$ of as low as 1054° C., and exhibits a value of (Ty−$T_L$) of as sufficiently large as 180° C. Further, Sample No. 2 has a volume electrical resistivity of 17.0 Ω·cm, which is sufficiently large, and has a dielectric constant (∈) of 5.49 and a dielectric dissipation factor (tan δ) of 0.0014 at a frequency of 1 MHz and a dielectric constant ∈ of 5.6 and a dielectric dissipation factor of 0.0056 at a frequency of 10 GHz, those values all being small values. Further, the acid resistance was also determined as "○" because the reduction rate of mass was low and the formation of a reaction product was not found, as in Sample No. 1. Spinning was performed also for Sample No. 2 by using 200 nozzles so that the resultant fiber had an average diameter of 5.0 μm, and an evaluation was performed on how well Sample No. 2 was formed into a glass fiber. As a result, a stable spinning operation was able to be performed without applying significant alterations to conventional glass production facilities. It was found that problems such as devitrification did not occur in the resultant glass fiber, bubbles did not remain in the glass fiber, and the measurement of the number of hollow fibers in the glass fiber showed that a homogeneous glass fiber satisfying 2 pieces or less/100,000 filaments was able to be spun. Further, the average diameter of these 200 glass fibers was 5.0 μm, the standard deviation was 0.40 μm, and the CV value obtained by dividing the standard deviation of the diameters by the average diameter and multiplying the resultant value by 100 was 8%, showing a good grade . From these results, it was clarified that Sample No. 2 had been formed into a glass fiber having an excellent grade and excellent performance for application to a printed wiring board. Thus, a printed wiring board manufactured by weaving the glass fiber by plain weaving to produce a prepreg and then using the prepreg can be a printed wiring board that exerts designing performance sufficiently.

The glass composition corresponding to Sample No. 4 in the examples is a glass composition that includes BaO at the largest content among the samples in the examples, and has an average linear expansion coefficient of 40.4×$10^{-7}$/° C., which is a very small value. Further, Sample No. 4 has a temperature Tw of 1491° C., the temperature Tw corresponding to $10^{2.0}$ dPa·s, has a temperature of 1284° C., the temperature corresponding to $10^{3.0}$ dPa·s, and has a value of (Ty−Tx) of 409° C., the value showing the temperature dependence of the viscosity, and hence Sample No. 4 is sufficiently short glass. Further, as for electrical performance, Sample No . 4 has a dielectric constant (∈) of 5.46 and a dielectric dissipation factor (tan δ) of 0.0012 at a frequency of 1 MHz and a dielectric constant ∈ of 5.6 and a dielectric dissipation factor of 0.0038 at a frequency of 10 GHz, satisfying a requirement of the present invention . Further, the acid resistance was also determined as "○" because the reduction rate of mass was low and the formation of a reaction product was not found, as in Sample No. 1. An evaluation was performed on how well Sample No. 4 was formed into a glass fiber. As a result, a stable spinning operation was able to be performed without applying significant alterations to conventional glass production facilities. It was found that problems such as phase separation and devitrification did not occur in the thus obtained glass fiber having the composition of glass of Sample No. 4, bubbles did not remain in the glass fiber, and the measurement of the number of hollow fibers in the glass fiber showed that a glass fiber satisfying 2 pieces or less/100,000 filaments was able to be spun.

The thus obtained glass composition corresponding to Sample No. 2 was used to produce a glass cloth by plain weaving. The resultant glass cloth included a small number of hollow fibers and had a low dielectric constant and a low dielectric dissipation factor, and hence the resultant glass cloth was a glass cloth that exerted performance suitable for application to a printed wiring board.

Comparative Examples

Next, Table 2 shows the survey results regarding samples corresponding to comparative examples, the samples being produced in the same procedures as those in the examples of the present invention, in the same way as the survey results of the examples are shown. The various measurement results shown in Table 2 are those obtained by using the same methods and apparatuses as those in the examples.

TABLE 2

| | | Comparative Example | | | | |
|---|---|---|---|---|---|---|
| Sample No. | | 101 | 102 | 103 | 104 | 105 |
| $SiO_2$ | | 54.9 | 76.1 | 56.6 | 54.6 | 51.3 |
| $Al_2O_3$ | | 13.7 | 0.3 | 13.7 | 12.9 | 13.7 |
| $B_2O_3$ | | 5.6 | 19.2 | 14.0 | 23.5 | 14.0 |
| MgO | | 1.7 | 0.3 | 1.9 | 2.4 | 9.7 |
| CaO | | 23.2 | 0.6 | 1.0 | 5.3 | 9.5 |
| SrO | | — | — | 4.3 | — | 1.0 |
| BaO | | — | — | 8.0 | — | — |
| MgO + CaO + SrO + BaO (=ΣRO) | | 24.9 | 0.9 | 15.2 | 7.7 | 20.2 |
| (BaO + SrO)/ΣRO | | | | 0.81 | | 0.05 |
| $Li_2O$ | | | 0.8 | — | 0.2 | — |
| $Na_2O$ | | 0.6 | 1.60 | 0.50 | 0.1 | 0.8 |
| $K_2O$ | | 0.1 | 1.1 | — | — | — |
| $Li_2O + Na_2O + K_2O$ | | 0.7 | 3.5 | 0.5 | 0.3 | 0.8 |
| $TiO_2$ | | 0.2 | — | — | 1.0 | — |
| Linear thermal expansion coefficient ($\times 10^{-7}/°$ C.) [30-380° C.] | | 62.5 | 31.9 | 38.9 | 32.0 | 55.8 |
| Temperature corresponding to $10^{7.6}$ dPa·s ($=T_x$) | | 851 | 810 | 908 | 901 | 835 |
| Temperature corresponding to $10^{3.0}$ dPa·s ($=T_y$) | | 1181 | 1336 | 1444 | 1332 | 1139 |
| Temperature corresponding to $10^{2.0}$ dPa·s ($=T_w$) | | 1350 | 1600° C. or more | 1600° C. or more | 1568 | |
| Liquidus temperature (° C.) ($=T_L$) | | 1054 | 953 | 950° C. or less | 980 | |
| Temperature dependence of viscosity: $T_y - T_x$ (° C.) | | 330 | 526 | 536 | 431 | 304 |
| $T_y - T_L$ (° C.) | | 127 | 383 | 480° C. or more | 352 | |
| Volume electrical resistivity log ρ (Ω·cm) [150° C.] | | 17.2 | 13.4 | 13.0 | 12.7 | 13.5 |
| Dielectric constant (∈) | Frequency of 1 MHz | 7.00 | 4.26 | 5.35 | 4.69 | 6.10 |
| | Frequency of 10 GHz | 6.8 | 4.3 | 5.5 | 4.7 | 6.2 |
| Dielectric dissipation factor (tan δ) | Frequency of 1 MHz | 0.0015 | 0.0010 | 0.0025 | 0.0013 | 0.0025 |
| | Frequency of 10 GHz | 0.0051 | 0.0031 | 0.0108 | 0.0028 | 0.0127 |
| Number of hollow fibers (pieces/100,000 filaments) | | 0.3 | 10 | 20 | 5 | 5 |
| Acid resistance | | ○ | ○ | ○ | x | x |

The glass composition corresponding to Sample No. 101 in the comparative examples has a composition similar to that of glass generally called E glass, but the glass composition has a linear thermal expansion coefficient of as high as $62.5 \times 10^{-7}/°$ C., also has a dielectric constant of as high as 7.00 at a frequency of 1 MHz, and also has a dielectric constant of as high as 6.8 at a frequency of 10 GHz, and hence the glass composition is completely different from the present invention.

The glass composition corresponding to Sample No. 102 in the comparative examples does not include SrO and BaO, but because the content of $SiO_2$ is as high as 76.1%, its acid resistance is not deteriorated. However, because the content of $SiO_2$ is high, the glass composition has a value of a temperature of as high as 1336° C., the temperature being the spinning temperature and corresponding to $10^{3.0}$ dPa·s. When this glass fiber is used for a long period to perform spinning, deterioration of production ancillary facilities is caused, and hence the glass composition involves an economical problem. Further, the glass composition had a temperature Tw of as very high as 1600° C. or more, the temperature Tw being an indication of the melting temperature and corresponding to $10^{2.0}$ dPa·s. Thus, when the glass composition melts, bubbles are liable to remain in glass, and moreover, the glass composition is long glass having a value of (Ty−Tx) of 526° C., and hence the glass composition has a problem in spinnability.

In the glass composition corresponding to Sample No. 103 in the comparative examples, the ratio of the total content of SrO and BaO to the total content of alkaline-earth metal oxides is more than 0.5. The glass composition exhibits a temperature of more than 1400° C., the temperature corresponding to $10^{3.0}$ dPa·s, and is long glass having a value of (Ty−Tx) of 536° C. Thus, it was difficult to produce a glass fiber having a small diameter from the glass composition, and there occurred problems in the meltability and spinnability of its molten glass. The glass composition had a temperature Tw corresponding to $10^{2.0}$ dPa·s at a high level and did not include $CeO_2$, and hence, when the glass composition was melted, bubbles were liable to remain in glass. Thus, this composition of glass does not enable the production of a glass fiber satisfying the requirement that the number of hollow fibers is 2 pieces or less/100,000 filaments. Further, the glass composition has a dielectric dissipation factor of as high as 0.0025 at a frequency of 1 MHz and also has a dielectric dissipation factor of as high as 0.0108 at a frequency of 10 GHz, and hence there exists a problem in that its dielectric loss becomes large, leading to a slow transmission rate.

The glass composition corresponding to Sample No. 104 in the comparative examples is a glass composition free of SrO and BaO, and hence the ratio of the total content of SrO and BaO to the total content of alkaline-earth metal oxides is as low as 0.00. Thus, the temperature corresponding to $10^{3.0}$ dPa·s was as high as 1332° C. The temperature Tw corresponding to $10^{2.0}$ dPa·s, which was an indication of the melting temperature, was also as high as 1568° C. or more, and many bubbles were remaining when the glass composition was melted. When the glass composition was melted, phase separation property was found, and an acid resistance test found a reaction product formed by reaction with hydrochloric acid. Thus, the glass composition was a composition that had a risk of causing problems in etching treatment and the like which were carried out in a production process of a printed wiring board. The glass composition has a volume electrical resistivity log ρ of 12.7 Ω·cm, and hence, when the glass composition is used in a printed wiring board, the electrical reliability of the printed wiring board is low.

In the glass composition corresponding to Sample No. 105 in the comparative examples, the ratio of the total content of SrO and BaO to the total content of alkaline-earth metal oxides is as low as 0.05. The glass composition corresponding to Sample No. 105 had a dielectric constant of as high as 6.10 at a frequency of 1 MHz and also had a dielectric constant of as high as 6.2 at a frequency of 10 GHz. Further, this sample also has a dielectric dissipation factor of as high as 0.0025 at a frequency of 1 MHz and also has a dielectric dissipation factor of as high as 0.0127 at a frequency of 10 GHz, and hence there exists a problem in that its dielectric loss becomes large, leading to a slow transmission rate. In addition, remarkable phase separation property was observed when the glass composition was melted, and the remarkable phase separation property resulted in giving an adverse influence on the acid resistance of glass, and hence the glass composition corresponding to Sample No. 105 was a glass composition involving problems.

The above-mentioned series of evaluations performed in the examples and comparative examples have clarified that the glass composition for a glass fiber of the present invention is suitable to be used for a glass fiber having a small diameter which is used in a printed wiring board required to realize high-density mounting, and the glass composition exerts excellent spinnability when a glass fiber is produced, leading to high production efficiency and resulting in being able to provide a glass fiber having a stable grade.

The invention claimed is:

1. A glass fiber, comprising a glass composition comprising, in terms of oxides by mass %, 45 to 65% of $SiO_2$, 10 to 20% of $Al_2O_3$ 13 to 25% of $B_2O_3$, 5.5 to 9% of MgO, 0 to 10% of CaO, 0 to 1% of $Li_2O+Na_2O+K_2O$, SrO, and BaO,
   wherein the glass composition has a temperature Ty of less than 1300° C. at $10^{3.0}$ dPa·s, and
   wherein the glass fiber has an average diameter of 3 to 7.2 µm.

2. The glass fiber according to claim 1, wherein the glass composition further comprises 0.01 to 5.0% of $CeO_2$ in terms of oxides by mass %.

3. The glass fiber according to claim 1, wherein a content of SrO is 0.1 to 10% and a content of BaO is 0.1 to 10% in terms of oxides by mass %.

4. The glass fiber according to claim 1, wherein a total content of alkaline-earth metal oxides including MgO, CaO, SrO, and BaO is 10 to 25% in terms of oxides by mass %, and a value obtained by dividing a total content of SrO and BaO by the total content of the alkaline-earth metal oxides is in a range of 0.15 to 0.50.

5. The glass fiber according to claim 1, wherein the glass composition has a dielectric constant of 6.0 or less and a dielectric dissipation factor of $20\times10^{-4}$ or less at a frequency of 1 MHz.

6. The glass fiber according to claim 1, wherein the glass composition has a dielectric constant of 6.0 or less and a dielectric dissipation factor of $100\times10^{-4}$ or less at a frequency of 10 GHz.

7. The glass fiber according to claim 1, which is used for forming an organic resin composite material by forming the glass fiber into a glass cloth or a non-woven fabric and combining it with an organic resin material.

8. A glass fiber sheet, comprising the glass fiber of according to claim 1, the glass fiber sheet being combined with an organic resin material to form an organic resin composite material.

9. The glass fiber sheet according to claim 8, wherein the glass fiber sheet is a glass cloth or glass paper.

* * * * *